(12) United States Patent
Hou

(10) Patent No.: US 8,405,086 B1
(45) Date of Patent: Mar. 26, 2013

(54) PIXEL STRUCTURE OF DISPLAY PANEL AND METHOD FOR MANUFACTURING THE SAME

(75) Inventor: Hung-lung Hou, Shenzhen (CN)

(73) Assignee: Shenzhen China Star Optoelectronics Technology Co., Ltd., Guangdong (CN)

(*) Notice: Subject to any disclaimer, the term of this patent is extended or adjusted under 35 U.S.C. 154(b) by 0 days.

(21) Appl. No.: 13/379,880

(22) PCT Filed: Nov. 4, 2011

(86) PCT No.: PCT/CN2011/081773
§ 371 (c)(1),
(2), (4) Date: Dec. 21, 2011

(51) Int. Cl.
*H01L 31/20* (2006.01)
*H01L 31/0232* (2006.01)
*H05B 37/02* (2006.01)

(52) U.S. Cl. ............ 257/59; 257/66; 257/72; 257/88; 257/E27.111; 257/E29.003; 257/E29.273; 315/169.1; 315/169.3; 345/76; 345/78; 345/82; 349/42; 349/43; 349/54; 438/30; 438/128; 438/149; 438/160

(58) Field of Classification Search .......... 257/59, 257/66, 72, 88, E27.111, E29.003, E29.273; 315/169.1, 169.3; 345/76, 78, 82; 349/42, 349/43, 54; 438/30, 128, 149, 160
See application file for complete search history.

(56) References Cited

U.S. PATENT DOCUMENTS

| | | | |
|---|---|---|---|
| 6,710,548 B2* | 3/2004 | Kimura | 315/169.3 |
| 7,158,106 B2* | 1/2007 | Cok et al. | 345/76 |
| 8,279,143 B2* | 10/2012 | Nathan et al. | 345/78 |
| 2004/0178409 A1* | 9/2004 | Hong et al. | 257/59 |
| 2004/0263445 A1* | 12/2004 | Inukai et al. | 345/82 |
| 2010/0109011 A1* | 5/2010 | Kim et al. | 257/59 |

* cited by examiner

*Primary Examiner* — Dao H Nguyen
(74) *Attorney, Agent, or Firm* — Ditthavong Mori & Steiner, P.C.

(57) ABSTRACT

The present invention provides a pixel structure of a display panel and a method for manufacturing the same. The method comprises the following steps: forming a first transistor and a second transistor on a substrate, wherein the first transistor is connected between the second transistor and a data line, wherein the second transistor is connected to a first gate line and a second gate line; and forming a pixel electrode, wherein the pixel electrode is connected to the first transistor. The present invention can improve a deformation problem of signal waveforms due to delay.

14 Claims, 7 Drawing Sheets

PIXEL STRUCTURE OF DISPLAY PANEL AND METHOD FOR MANUFACTURING THE SAME

FIELD OF THE INVENTION

The present invention relates to a field of a display technology, and more particularly to a pixel structure of a display panel and a method for manufacturing the same.

BACKGROUND OF THE INVENTION

Liquid crystal displays (LCDs) have been widely applied in electrical products. Currently, most of LCDs are backlight type LCDs which comprise a liquid crystal panel and a backlight module. Currently, the LCD panel may include a color filter (CF) substrate and a thin film transistor (TFT) array substrate. The CF substrate includes a plurality of color filters and a common electrode. The TFT array substrate includes a plurality of parallel scanning lines, a plurality of parallel data lines, a plurality of TFTs and a plurality of pixel electrodes. The scanning lines are respectively vertical to the data lines. Each adjacent two of the scanning lines and each adjacent two of the data lines intersect to define a pixel area.

However, when a size of the display panel is getting larger, the delay of scanning signals on the display panel is likely to occur. Thus, a waveform of the scanning signals is likely to deform, significantly deteriorating the accuracy of charging with data signals.

As a result, it is necessary to provide a pixel structure of a display panel and a method for manufacturing the same to solve the problems existing in the conventional technologies, as described above.

SUMMARY OF THE INVENTION

The present invention provides a pixel structure of a display panel and a method for manufacturing the same to solve the signal delay problem.

A primary object of the present invention is to provide a pixel structure of a display panel formed on a substrate, wherein the pixel structure comprises: a pixel electrode; a first transistor comprising a first gate electrode, a first source electrode and a first drain electrode, wherein the first drain electrode is electrically connected to the pixel electrode, and the first source electrode is electrically connected to a data line; and a second transistor comprising a second gate electrode, a second source electrode and a second drain electrode, wherein the second source electrode is electrically connected to a first gate line, and the second drain electrode is electrically connected to the first gate electrode of the first transistor, and the second gate electrode is electrically connected to a second gate line.

In one embodiment of the present invention, the second gate line is parallel to the first gate line.

In one embodiment of the present invention, the second gate electrode is formed by a portion of the second gate line.

In one embodiment of the present invention, the second source electrode extends from the first gate line.

In one embodiment of the present invention, the second gate line is parallel to the data line.

In one embodiment of the present invention, the second gate electrode is electrically connected to the second gate line by means of a first contact hole.

In one embodiment of the present invention, the second source electrode is electrically connected to the first gate line by means of a second contact hole.

In one embodiment of the present invention, the second drain electrode is electrically connected to the first gate electrode by means of a third contact hole.

Another object of the present invention is to provide a method for manufacturing a pixel structure, comprising the following steps: forming a first electrode and a second electrode on a substrate; forming a first gate insulating layer on the first electrode; forming a semiconductor layer on the first gate insulating layer and the second electrode; forming a first source electrode and a first drain electrode on the semiconductor layer, wherein the first source electrode and the first drain electrode are positioned to the first electrode, and a portion of the first electrode acts as the first gate electrode; forming a second gate insulating layer on the semiconductor layer, wherein the second gate insulating layer is positioned to the second electrode and another portion of the first electrode; forming a second gate electrode on the second gate insulating layer, wherein the second electrode acts the second source electrode, and the another portion of the first electrode 111 acts the second drain electrode; and forming a pixel electrode, wherein the pixel electrode electrically connected to the first drain electrode.

In one embodiment of the present invention, the first electrode, the second electrode and the first gate line are formed on the substrate at the same time, and the second electrode extends from the first gate line.

Still another object of the present invention is to provide a method for manufacturing a pixel structure, comprising the following steps: forming a first gate electrode and a second gate electrode on a substrate; forming a gate insulating layer on the first gate electrode and the second gate electrode; forming a first semiconductor layer and a second semiconductor layer on the gate insulating layer, wherein the first semiconductor layer is positioned to the first gate electrode, and the second semiconductor layer is positioned to the second gate electrode; forming a first source electrode and a first drain electrode on the first semiconductor layer; forming a second source electrode and a second drain electrode on the second semiconductor layer, wherein the second drain electrode is electrically connected to the first gate electrode by means of a contact hole; and forming a pixel electrode, wherein the pixel electrode electrically connected to the first drain electrode.

In one embodiment of the present invention, the first gate electrode, the second gate electrode and the first gate line are formed on the substrate at the same time.

In one embodiment of the present invention, the first source electrode, the second source electrode, the first drain electrode, the second drain electrode and a second gate line are formed at the same time, and the second gate line is parallel to a data line.

In one embodiment of the present invention, the second gate electrode is electrically connected to the second gate line by means of a first contact hole, and the second source electrode is electrically connected to the first gate line by means of a second contact hole, and the second drain electrode is electrically connected to the first gate electrode by means of a third contact hole.

The pixel structure of the display panel and the method for manufacturing the same can enhance accuracy of gate signals from the gate lines, for improving the deformation problem of the signal waveform resulting from the signal delay, as well as enhancing the charging accuracy of the signals from the data lines. Therefore, with the use of the pixel structure of the display panel of the present invention, the charging effect for the pixels of the display panel is improved.

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
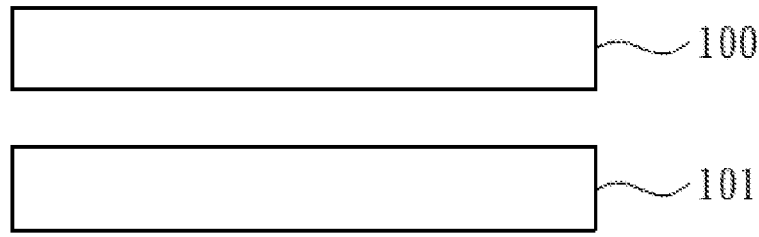
FIG. 1 is a cross-sectional view showing a display panel and a backlight module according to an embodiment of the present invention.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, structure-like elements are labeled with like reference numerals.

Referring to FIG. 1, a cross-sectional view showing a display panel and a backlight module according to an embodiment of the present invention is illustrated. The display panel 100 of the present invention may be a liquid crystal display (LCD) panel, an organic light emitting diode (OLED) panel, a plasma display panel (PDP) or a field emission display (FED) panel. Taking the LCD for example, the display panel 100 may be an LCD panel assembled with a backlight module, thereby forming an LCD apparatus.

Figure 2:
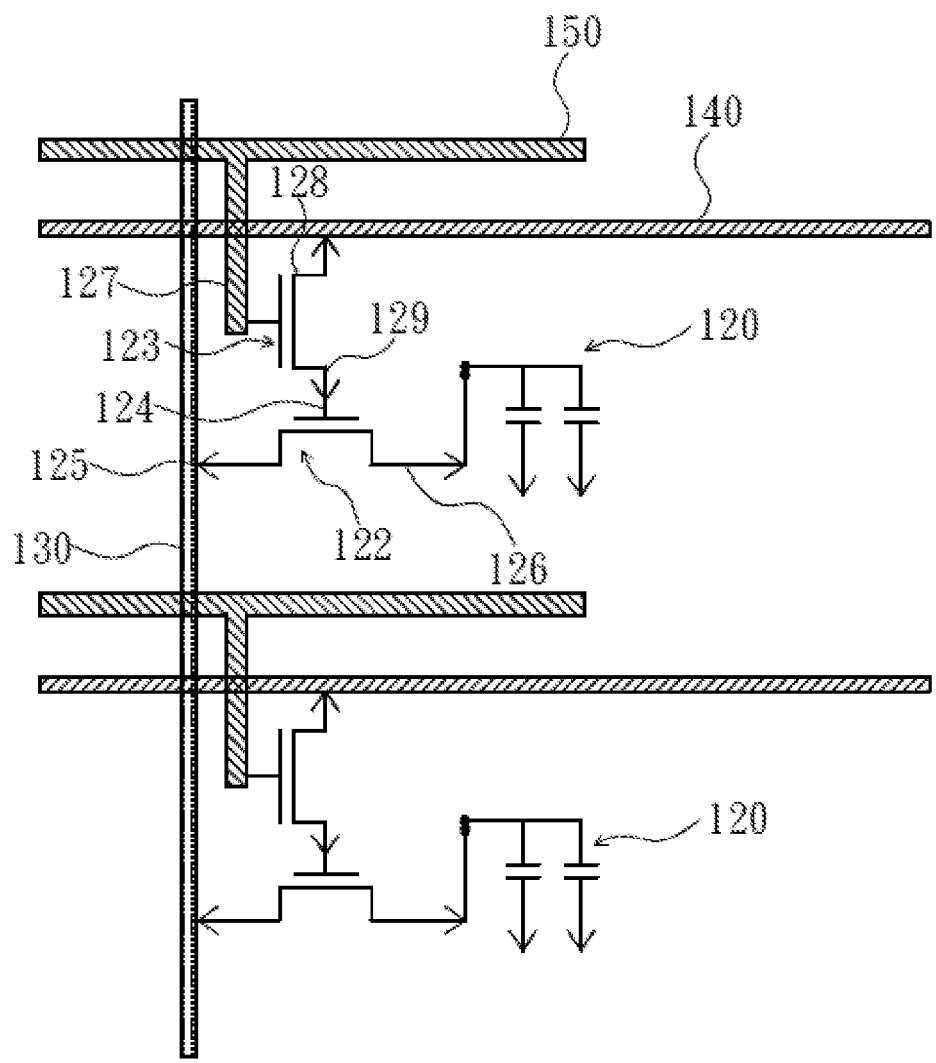
FIG. 2 is an equivalent circuit diagram showing a pixel structure of the display panel according to a first embodiment of the present invention.
Figure 3:
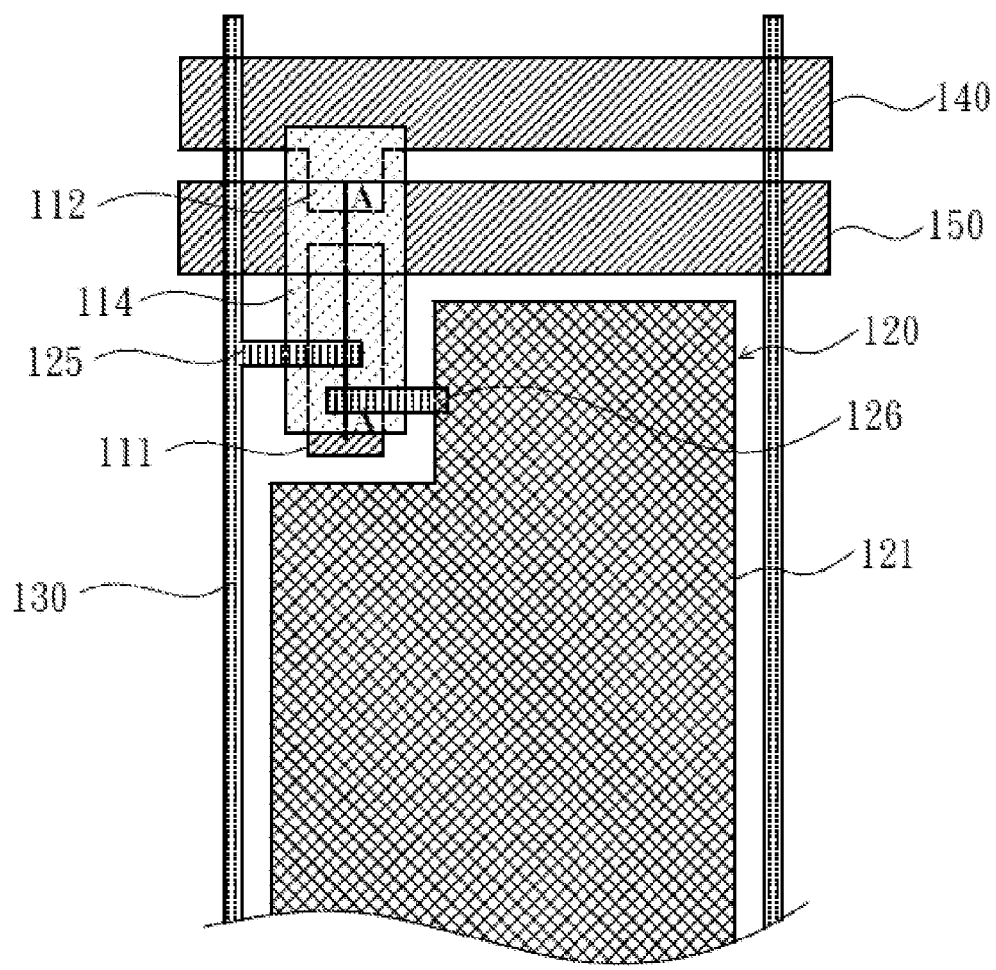
FIG. 3 is schematic diagram showing the pixel structure according to the first embodiment of the present invention.
Figure 4:
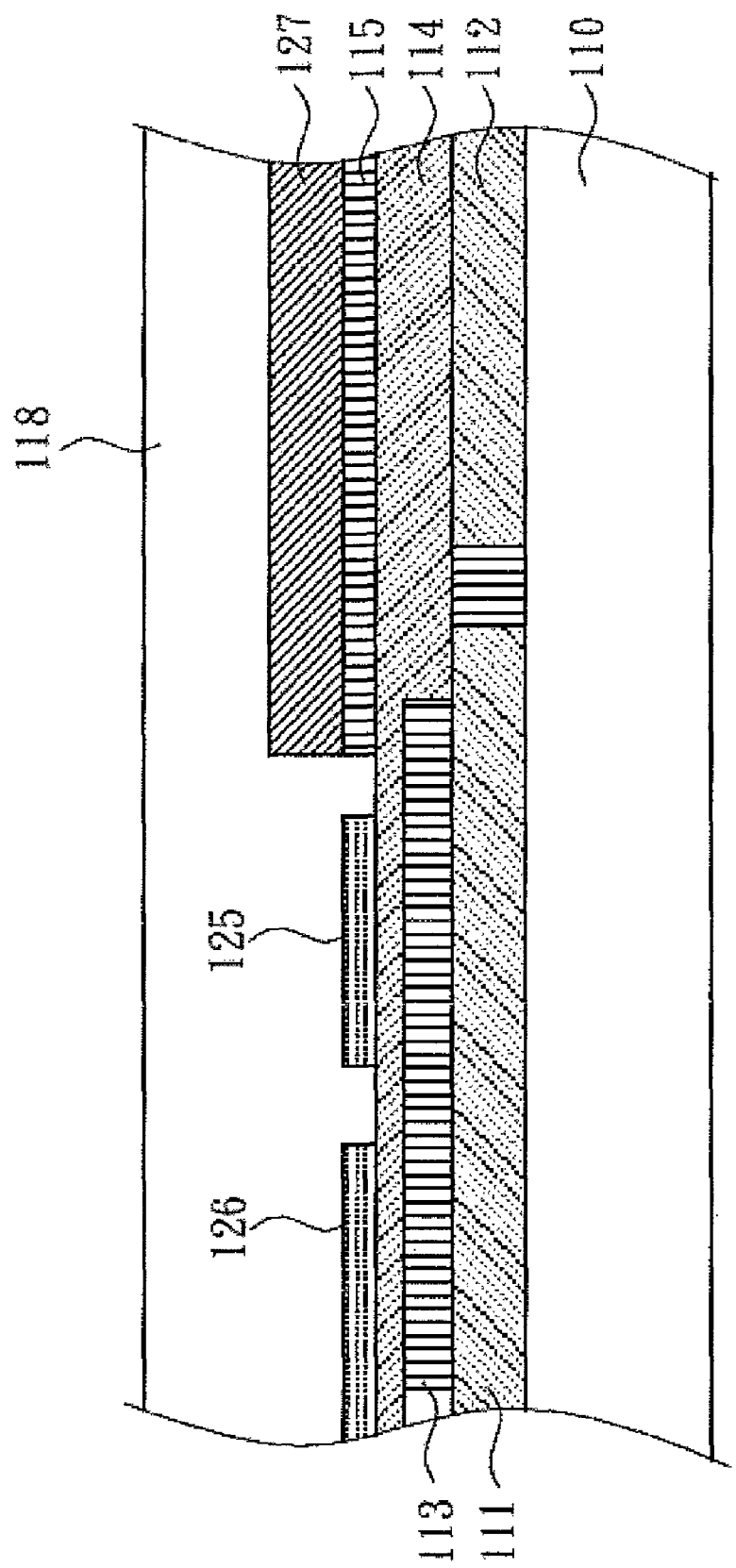
FIG. 4 is a cross-sectional view showing a cross-sectional view along a cross-sectional line A-A shown in FIG. 3.

Referring to FIG. 2, FIG. 3 and FIG. 4, FIG. 2 is an equivalent circuit diagram showing a pixel structure of the display panel according to a first embodiment of the present invention, and FIG. 3 is schematic diagram showing the pixel structure according to the first embodiment of the present invention, and FIG. 4 is a cross-sectional view showing a cross-sectional view along a cross-sectional line A-A shown in FIG. 3. The display panel 100 of the present embodiment can comprise a substrate 110, a plurality of pixels 120, a plurality of data lines 130, a plurality of first gate lines 140 and a plurality of second gate lines 150. The data lines 130 and the first gate lines 140 are arranged in a crisscross pattern on the substrate 110. The pixels 120 are arranged in a matrix manner on the substrate 110, and positioned between the data lines 130 and the first gate lines 140. The second gate lines 150 can be parallel to the data lines 130 or the first gate lines 140. In the first embodiment, the second gate lines 150 are parallel to the first gate lines 140.

Referring to FIG. 2 again, the substrate 110 may be a glass substrate or a flexible plastic substrate. In this embodiment, the substrate 110 may be a TFT array substrate. When the display panel 100 is an LCD panel, it may further comprise a liquid crystal layer (not shown) and another substrate (not shown), such as a CF substrate. At this time, the liquid crystal layer is formed between the TFT array substrate (substrate 110) and the CF substrate. The CF substrate can include a common electrode configured to provide a common voltage Vcom.

Referring to FIG. 2 again, each of the pixels 120 can comprise a pixel electrode 121, a first transistor 122 and a second transistor 123. The pixel electrode 121 is preferably made of electrically conductive and transparent material, such as ITO, IZO, ITZO, AZO, GZO, ZnO or PEDOT. The first transistor 122 and the second transistor 123 may be TFTs which are electrically connected to the data lines 130, the first gate lines 140, the second gate lines 150 and the pixel electrode 121. The first transistor 122 is configured to allow the data lines 130 to provide data signals to the pixel electrode 121. The second transistor 123 is configured to modify gate signals which are transmitted from the first gate lines 140, and to provide the modified gate signals to the first transistor 122.

Referring to FIG. 2 again, the first transistor 122 comprises a first gate electrode 124, a first source electrode 125 and a first drain electrode 126, wherein the first drain electrode 126 is electrically connected to the pixel electrode 121, and the first source electrode 125 is electrically connected to a data line 130. The second transistor 123 comprises a second gate electrode 127, a second source electrode 128 and a second drain electrode 129, wherein the second source electrode 128 is electrically connected to a first gate line 140, and the second drain electrode 129 is electrically connected to the first gate electrode 124 of the first transistor 122, and the second gate electrode 127 is electrically connected to a second gate line 150.

When the first gate lines 140 transmits the gate signals to the first transistor 122, the transmitted gate signals from the first gate lines 140 can be modified by the second transistor 123, and the second transistor 123 can provide the modified gate signals to the first transistor 122. Therefore, when the data lines 130 transmits the data signals to the pixel electrode 121 through the first transistor 122, the first transistor 122 can be turned on by the modified and more accurate gate signals for enhancing the charging accuracy of the signals from the data lines 130, so as to improve the delay problem of the gate signals.

Figure 5:
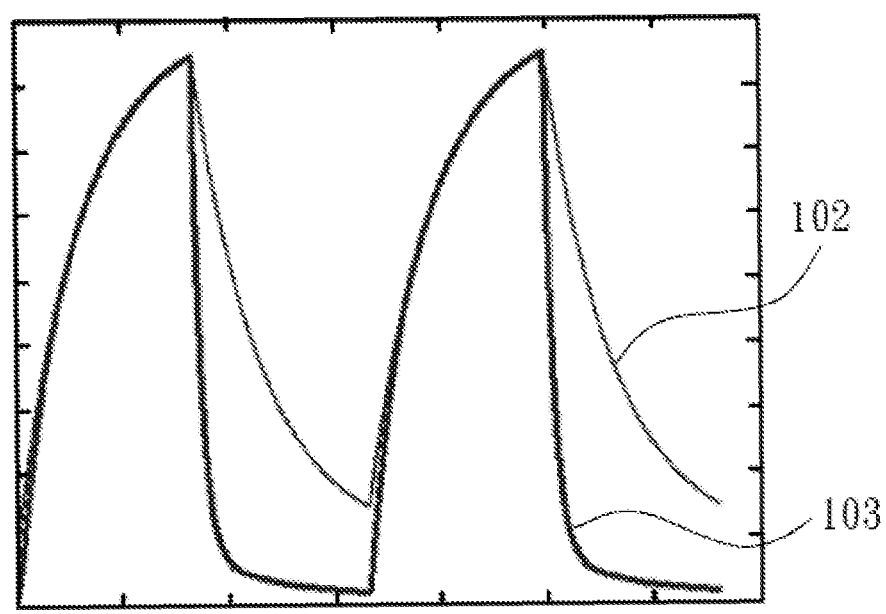
FIG. 5 is an oscillogram showing the gate signal of the display panel according to the present invention.

Referring to FIG. 5, an oscillogram showing the gate signal of the display panel according to the present invention is illustrated. A line 102 indicates a gate signal of a conventional display panel, and a line 103 indicates the modified gate signal of the display panel of the present invention. Referring to FIG. 5 again, in comparison with the deformed waveform of the line 102, the waveform of the modified gate signal of the line 103 can improve the signal deformation problem of the gate signal resulting from the signal delay. Therefore, the pixels 120 of the display panel 100 can improve the delay problem of the gate signals to enhancing the charging accuracy of the signals from the data lines 130.

Referring to FIG. 4 again, when manufacturing the pixel structure 120 of the display panel 100 of the present embodiment, firstly a first electrode 111 and a second electrode 112 are formed on the substrate 110, wherein there is an interval between the first electrode 111 and the second electrode 112.

The first electrode 111 and the second electrode 112 can be made of Al、Ag、Cu、Mo、Cr、W、Ta、Ti, metal nitride or any alloys thereof by using a photolithography process. Furthermore, the material of the electrodes may be a multi-layer structure with heat-resistant film and lower resistance film, such as dual-layer structure with molybdenum nitride film and Al film. In this embodiment, the electrodes 111, 112 and the first gate lines 140 can be formed on the substrate 110 at the same time by using the photolithography process, and the second electrode 112 extends from the first gate line 140.

Referring to FIG. 4 again, subsequently, a first gate insulating layer 113 is formed on the first electrode 111. The material of the first gate insulating layer 113 may be silicon nitride ($SiN_x$) or silicon oxide ($SiO_x$) which may be formed with a plasma enhanced chemical vapor deposition (PECVD) method. Subsequently, a semiconductor layer 114 is formed on the first gate insulating layer 113 and the second electrode 112. The material of the semiconductor layer 114 may be N+ a-Si (or silicide) heavily doped with N dopant (such as arsenic).

Referring to FIG. 4 again, subsequently, the first source electrode 125 and the first drain electrode 126 are formed on the semiconductor layer 114, wherein the first source electrode 125 and the first drain electrode 126 are positioned to the first electrode 111. That is, the first source electrode 125 and the first drain electrode 126 are positioned above the first electrode 111. In this case, a portion of the first electrode 111 acts as the first gate electrode 124, and the first source electrode 125 is electrically connected to the data line 130. Therefore, the portion of the first electrode 111 (the first gate electrode 124), the first gate insulating layer 113, the semiconductor layer 114, the first source electrode 125 and the first drain electrode 126 are formed, so as to obtain the first transistor 122. The material of the first source electrode 125 and the first drain electrode 126 may be Al、Ag、Cu、Mo、Cr、W、Ta、Ti, metal nitride or any alloys thereof.

Referring to FIG. 4 again, subsequently, a second gate insulating layer 115 is formed on the semiconductor layer 114, wherein the second gate insulating layer 115 is positioned to the second electrode 112 and another portion of the first electrode 111. That is, the second gate insulating layer 115 is positioned above the second electrode 112 and the another portion of the first electrode 111. Subsequently, the second gate electrode 127 is formed on the second gate insulating layer 115, wherein the second electrode 112 acts the second source electrode 128, and the another portion of the first electrode 111 acts the second drain electrode 129. Therefore, the second gate electrode 127, the second gate insulating layer 115, the semiconductor layer 114, the second electrode 112 (the second source electrode 128) and the another portion of the first electrode 111 (the second drain electrode 129) are formed, so as to obtain the second transistor 123. In this case, the second gate electrode 127 is formed by a portion of the second gate line 150, and the material of the second gate electrode 127 may be Al、Ag、Cu、Mo、Cr、W、Ta、Ti, metal nitride or any alloys thereof which can be identical or different to the material of the electrodes 111, 112.

Referring to FIG. 4 again, subsequently, the pixel electrode 121 is formed, wherein the pixel electrode 121 is electrically connected to the first drain electrode 126 of the first transistor 122 and formed on a passivation layer 118. The passivation layer 118 can be formed on the source electrode 125 and the drain electrode 126, wherein the passivation layer 118 includes at least one contact hole (not shown) to expose a portion of the drain electrodes 126, and the pixel electrode 121 covers the contact hole for being electrically connected to the drain electrode 126, thereby achieving the pixel structure 120 of the display panel 100 of the present embodiment.

Figure 6:
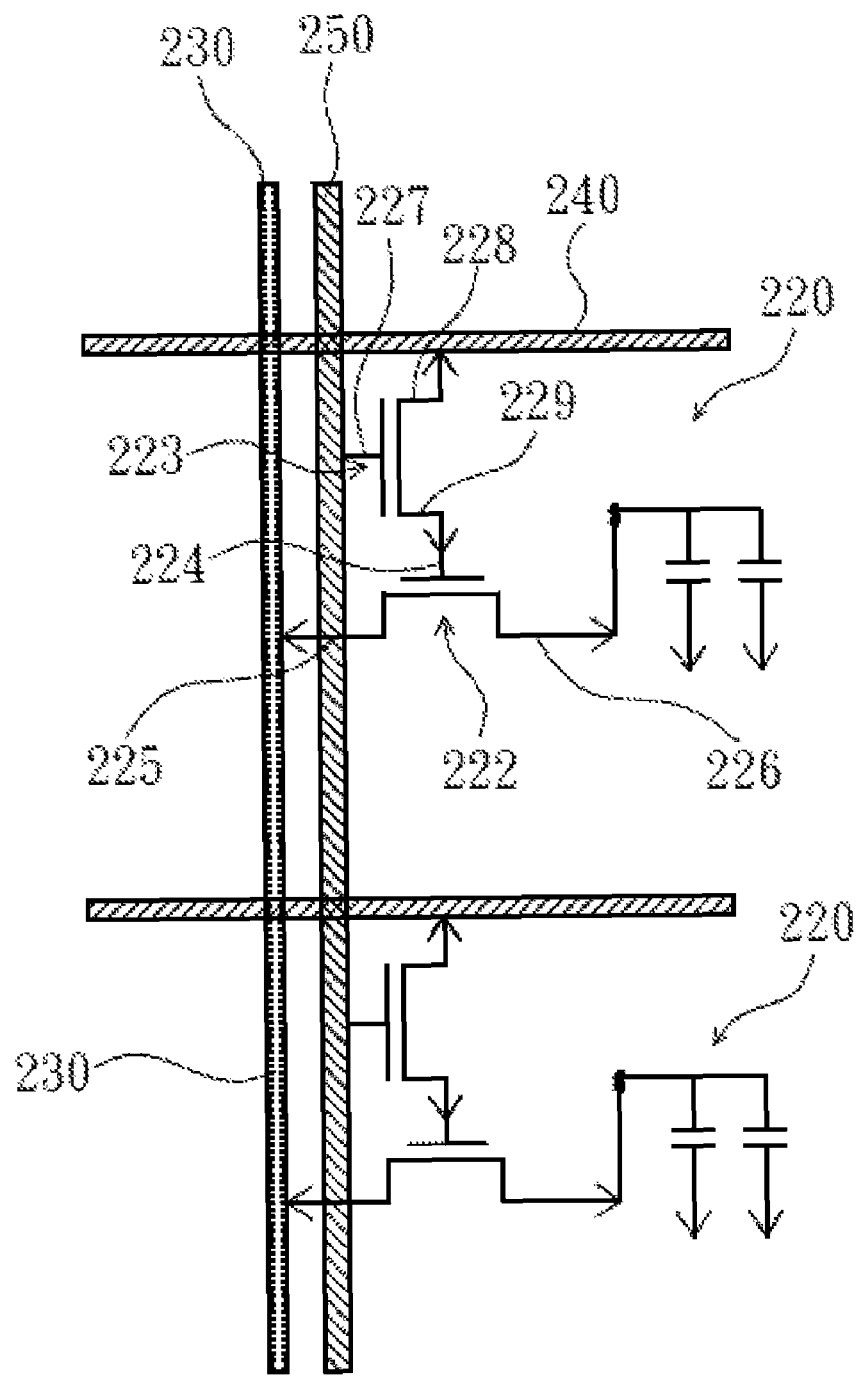
FIG. 6 is an equivalent circuit diagram showing a pixel structure of a display panel according to a second embodiment of the present invention.
Figure 7:
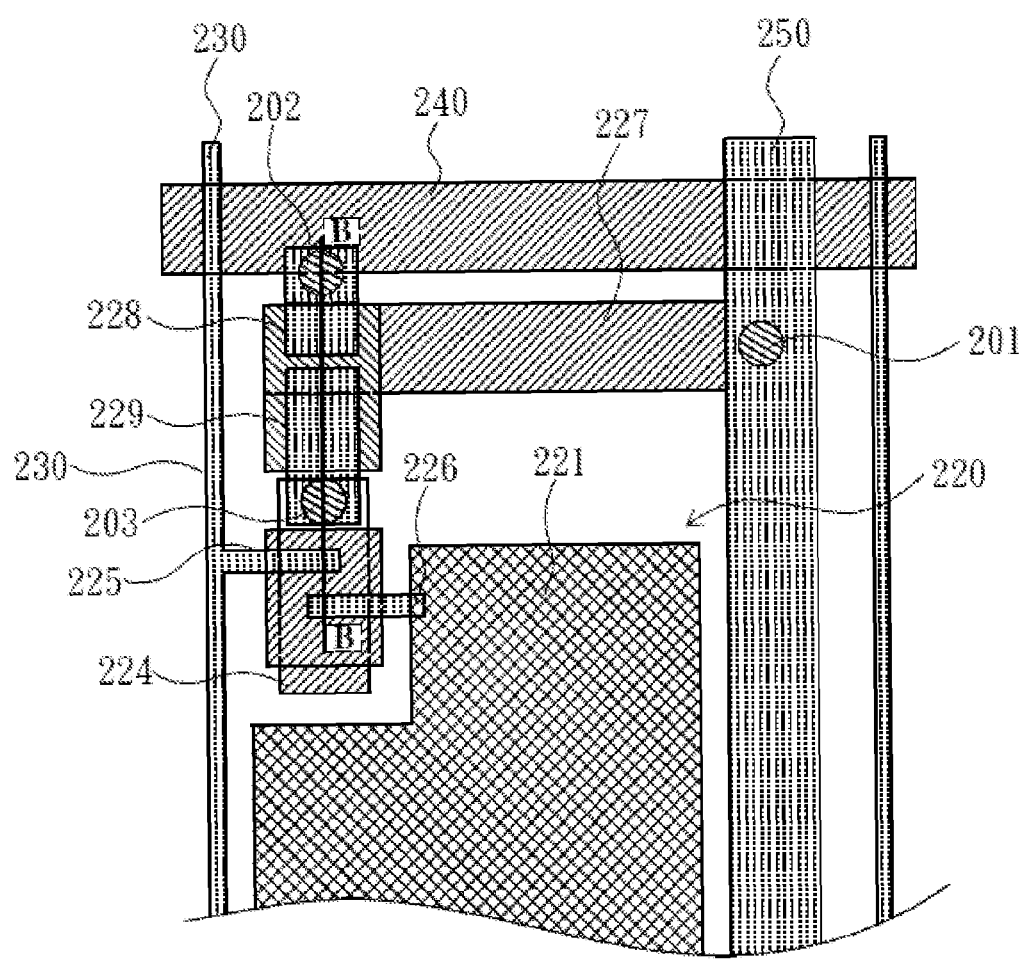
FIG. 7 is schematic diagram showing a pixel structure according to the second embodiment of the present invention.
Figure 8:
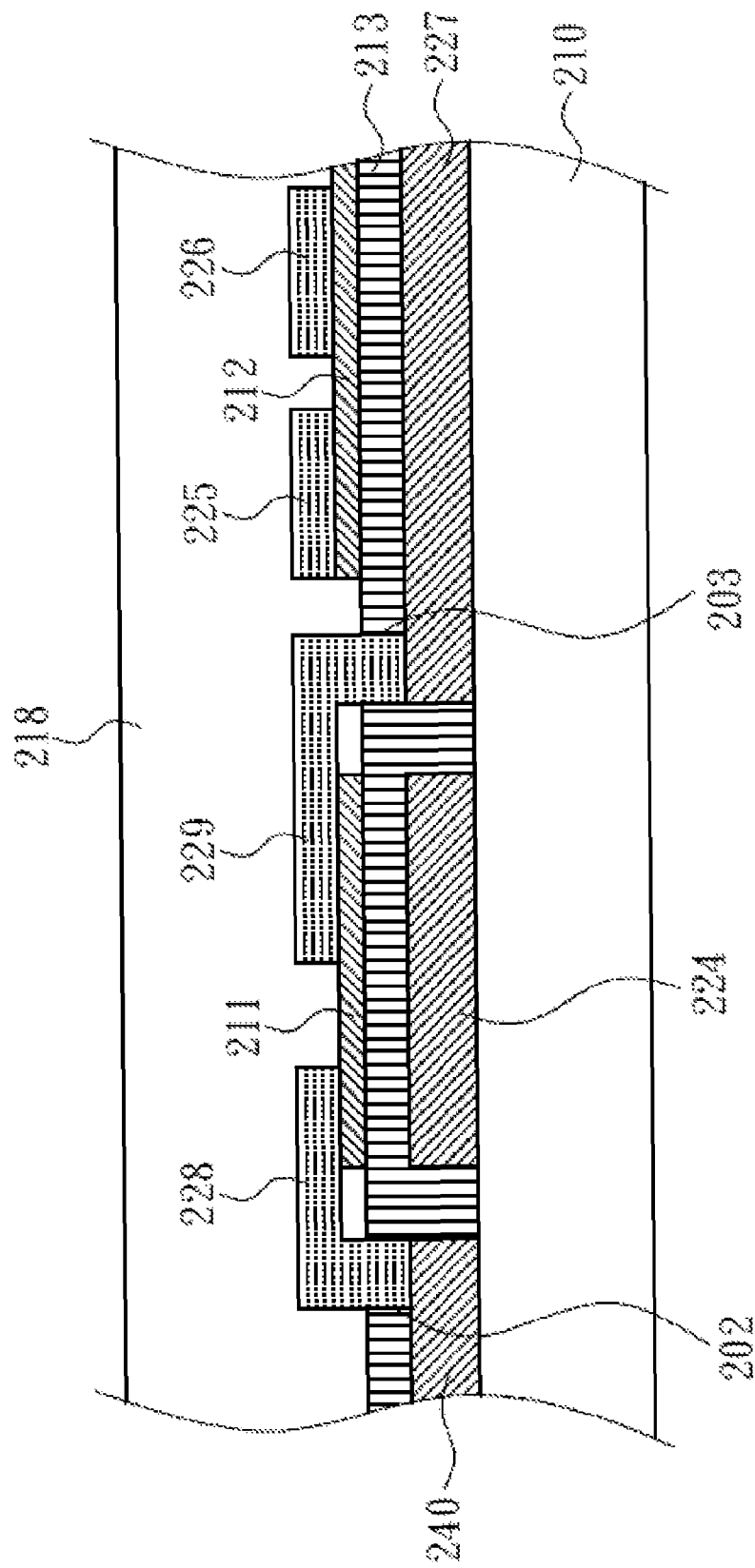
FIG. 8 is a cross-sectional view showing a cross-sectional view along a cross-sectional line B-B shown in FIG. 7.

Referring to FIG. 6, FIG. 7 and FIG. 8, FIG. 6 is an equivalent circuit diagram showing a pixel structure of a display panel according to a second embodiment of the present invention, and FIG. 7 is schematic diagram showing a pixel structure according to the second embodiment of the present invention, and FIG. 8 is a cross-sectional view showing a cross-sectional view along a cross-sectional line B-B shown in FIG. 7. Each of the pixels 220 of the second embodiment can comprise a pixel electrode 221, a first transistor 222 and a second transistor 223. The first transistor 222 and the second transistor 223 are electrically connected to the data lines 230, the first gate lines 240, the second gate lines 250 and the pixel electrode 221. The first transistor 222 is configured to allow the data lines 230 to provide data signals to the pixel electrode 221. The second transistor 223 is configured to modify gate signals which are transmitted from the first gate lines 240, and to provide the modified gate signals to the first transistor 222. In the second embodiment, the second gate lines 250 are parallel to the data lines 230.

Referring to FIG. 8 again, the first transistor 222 comprises a first gate electrode 2224, a first source electrode 225 and a first drain electrode 226, wherein the first drain electrode 226 is electrically connected to the pixel electrode 221, and the first source electrode 225 is electrically connected to a data line 230. The second transistor 223 comprises a second gate electrode 227, a second source electrode 228 and a second drain electrode 229, wherein the second source electrode 228 is electrically connected to a first gate line 240, and the second drain electrode 229 is electrically connected to the first gate electrode 224 of the first transistor 222, and the second gate electrode 227 is electrically connected to a second gate line 250.

Referring to FIG. 8 again, when manufacturing the pixel structure 220 of the display panel of the present embodiment, firstly the first gate electrode 224 and the second gate electrode 227 are formed on the substrate 110, wherein there is an interval between the first gate electrode 224 and the second gate electrode 227. The first gate electrode 224 and the second gate electrode 227 can be made of Al、Ag、Cu、Mo、Cr、W、Ta、Ti, metal nitride or any alloys thereof by using a photolithography process. Furthermore, the material of the electrodes may be a multi-layer structure with heat-resistant film and lower resistance film, such as dual-layer structure with molybdenum nitride film and Al film. In this embodiment, the electrodes 224, 227 and the first gate lines 240 can be formed on the substrate 210 at the same time by using the photolithography process.

Referring to FIG. 8 again, subsequently, a gate insulating layer 213 is formed on the first gate electrode 224 and the second gate electrode 227. The material of the gate insulating layer 213 may be silicon nitride ($SiN_x$) or silicon oxide ($SiO_x$). Subsequently, a first semiconductor layer 211 and a second semiconductor layer 212 are formed on the gate insulating layer 213, wherein the first semiconductor layer 211 is positioned to the first gate electrode 224, and the second semiconductor layer 212 is positioned to the second gate electrode 227. That is, the first semiconductor layer 211 is positioned above the first gate electrode 224, and the second semiconductor layer 212 is positioned above the second gate electrode 227. The material of the semiconductor layer 211, 212 may be N+ a-Si (or silicide) heavily doped with N dopant (such as arsenic).

Referring to FIG. 8 again, subsequently, the first source electrode 225 and the first drain electrode 226 are formed on the first semiconductor layer 211, and the second source electrode 228 and the second drain electrode 229 are formed on the second semiconductor layer 212. Therefore, the first gate electrode 224, the gate insulating layer 213, the first semiconductor layer 211, the first source electrode 225 and the first drain electrode 226 are formed, so as to obtain the first transistor 222. Furthermore, the second gate electrode 227, the gate insulating layer 213, the second semiconductor layer 212, the second source electrode 228 and the second drain electrode 229 are formed, so as to obtain the second transistor 223. In this case, the material of the source electrodes 225, 228 and the drain electrodes 226, 229 may be Al、Ag、Cu、Mo、Cr、W、Ta、Ti, metal nitride or any alloys thereof.

Referring to FIG. 8 again, in the second embodiment, the source electrodes 225, 228, the drain electrodes 226, 229 and the second gate lines 250 can be formed at the same time using the photolithography process. Moreover, in the second embodiment, the electrodes and signal lines positioned at different layers can be connected to each other by means of contact holes. In this case, the second gate electrode 227 can be electrically connected to the second gate line 250 by means of the contact hole 201, and the second source electrode 228 can be electrically connected to the first gate line 240 by means of the contact hole 202, and the second drain electrode 229 can be electrically connected to the first gate electrode 224 by means of the contact hole 203.

Referring to FIG. 8 again, subsequently, the pixel electrode 221 is formed, wherein the pixel electrode 221 is electrically connected to the first drain electrode 226 of the first transistor 222 and formed on a passivation layer 218. The passivation layer 218 can formed on the source electrode 225, 228 and the drain electrode 226, 229, wherein the passivation layer 218 includes at least one contact hole (not shown) to expose a portion of the drain electrodes 226, and the pixel electrode 221 covers the contact hole for being electrically connected to the drain electrode 226, thereby achieving the pixel structure 220 of the display panel of the present embodiment.

As described above, with the use of the pixel structure of the display panel of the present invention and the method for manufacturing the same, the second transistor is utilized to modify the gate signals transmitted from the gate lines for improving the deformation problem of the signal waveform resulting from the signal delay, as well as enhancing the charging accuracy of the signals from the data lines. Therefore, the pixel structure of the display panel of the present invention can improve the charging effect (such as charging rate and uniformity) for the pixels of the display panel.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A pixel structure of a display panel formed on a substrate, wherein the pixel structure comprises:
   a pixel electrode;
   a first transistor comprising a first gate electrode, a first source electrode and a first drain electrode, wherein the first drain electrode is electrically connected to the pixel electrode, and the first source electrode is electrically connected to a data line; and
   a second transistor comprising a second gate electrode, a second source electrode and a second drain electrode, wherein the second source electrode is electrically connected to a first gate line, and the second drain electrode is electrically connected to the first gate electrode of the first transistor, and the second gate electrode is electrically connected to a second gate line.

2. The pixel structure according to claim 1, wherein the second gate line is parallel to the first gate line.

3. The pixel structure according to claim 2, wherein the second gate electrode is formed by a portion of the second gate line.

4. The pixel structure according to claim 2, wherein the second source electrode extends from the first gate line.

5. The pixel structure according to claim 1, wherein the second gate line is parallel to the data line.

6. The pixel structure according to claim 5, wherein the second gate electrode is electrically connected to the second gate line by means of a first contact hole.

7. The pixel structure according to claim 5, wherein the second source electrode is electrically connected to the first gate line by means of a second contact hole.

8. The pixel structure according to claim 5, wherein the second drain electrode is electrically connected to the first gate electrode by means of a third contact hole.

9. A method for manufacturing a pixel structure, comprising the following steps:
   forming a first electrode and a second electrode on a substrate;
   forming a first gate insulating layer on the first electrode;
   forming a semiconductor layer on the first gate insulating layer and the second electrode;
   forming a first source electrode and a first drain electrode on the semiconductor layer, wherein the first source electrode and the first drain electrode are positioned to the first electrode, and a portion of the first electrode acts as a first gate electrode;
   forming a second gate insulating layer on the semiconductor layer, wherein the second gate insulating layer is positioned to the second electrode and another portion of the first electrode;
   forming a second gate electrode on the second gate insulating layer, wherein the second electrode acts the second source electrode, and the another portion of the first electrode acts the second drain electrode; and
   forming a pixel electrode, wherein the pixel electrode electrically connected to the first drain electrode.

10. The method according to claim 9, wherein the first electrode, the second electrode and the first gate line are formed on the substrate at the same time, and the second electrode extends from the first gate line.

11. A method for manufacturing a pixel structure, comprising the following steps:
   forming a first gate electrode and a second gate electrode on a substrate;
   forming a gate insulating layer on the first gate electrode and the second gate electrode;
   forming a first semiconductor layer and a second semiconductor layer on the gate insulating layer, wherein the first semiconductor layer is positioned to the first gate electrode, and the second semiconductor layer is positioned to the second gate electrode;
   forming a first source electrode and a first drain electrode on the first semiconductor layer;
   forming a second source electrode and a second drain electrode on the second semiconductor layer, wherein the second drain electrode is electrically connected to the first gate electrode by means of a contact hole; and
   forming a pixel electrode, wherein the pixel electrode electrically connected to the first drain electrode.

12. The method according to claim 11, wherein the first gate electrode, the second gate electrode and the first gate line are formed on the substrate at the same time.

13. The method according to claim 12, wherein the first source electrode, the second source electrode, the first drain electrode, the second drain electrode and a second gate line are formed at the same time, and the second gate line is parallel to a data line.

14. The method according to claim 13, wherein the second gate electrode is electrically connected to the second gate line by means of a first contact hole, and the second source electrode is electrically connected to the first gate line by means of a second contact hole, and the second drain electrode is electrically connected to the first gate electrode by means of a third contact hole.

* * * * *